US008865599B2

(12) United States Patent
Bai et al.

(10) Patent No.: US 8,865,599 B2
(45) Date of Patent: Oct. 21, 2014

(54) SELF-LEVELING PLANARIZATION MATERIALS FOR MICROELECTRONIC TOPOGRAPHY

(71) Applicant: Brewer Science Inc., Rolla, MO (US)

(72) Inventors: Dongshun Bai, Rolla, MO (US); Xie Shao, Rolla, MO (US); Michelle Fowler, Rolla, MO (US); Tingji Tang, Spring, TX (US)

(73) Assignee: Brewer Science Inc., Rolla, MO (US)

( * ) Notice: Subject to any disclaimer, the term of this patent is extended or adjusted under 35 U.S.C. 154(b) by 62 days.

(21) Appl. No.: 13/672,527

(22) Filed: Nov. 8, 2012

(65) Prior Publication Data

US 2013/0113086 A1 May 9, 2013

Related U.S. Application Data

(60) Provisional application No. 61/556,879, filed on Nov. 8, 2011.

(51) Int. Cl.
| H01L 21/31 | (2006.01) |
| H01L 21/3105 | (2006.01) |
| H01L 21/02 | (2006.01) |
| H01L 21/027 | (2006.01) |
| C09D 127/18 | (2006.01) |
| H01L 29/02 | (2006.01) |
| B81C 1/00 | (2006.01) |
| C08L 33/16 | (2006.01) |
| C08L 33/14 | (2006.01) |

(52) U.S. Cl.
CPC ........... *H01L 21/31058* (2013.01); *C08L 33/16* (2013.01); *C08L 33/14* (2013.01); *H01L 21/02118* (2013.01); *H01L 21/0271* (2013.01); *C09D 127/18* (2013.01); *H01L 29/02* (2013.01); *B81C 1/00611* (2013.01); *B81C 2201/0119* (2013.01); *H01L 21/0212* (2013.01); *Y10S 438/958* (2013.01)
USPC ........... 438/760; 438/778; 438/780; 438/781; 438/958

(58) Field of Classification Search
USPC .......................... 438/760, 778, 780, 781, 958
See application file for complete search history.

(56) References Cited

U.S. PATENT DOCUMENTS

| 4,515,828 | A | * | 5/1985 | Economy et al. ............. 427/129 |
| 4,619,837 | A | * | 10/1986 | Brown .......................... 427/498 |
| 5,397,603 | A | | 3/1995 | Okude et al. |
| 5,434,107 | A | * | 7/1995 | Paranjpe ....................... 438/760 |
| 5,679,610 | A | * | 10/1997 | Matsuda et al. ............. 438/584 |
| 5,736,424 | A | * | 4/1998 | Prybyla et al. ............... 438/780 |
| 2004/0029041 | A1 | * | 2/2004 | Shih et al. .................. 430/271.1 |

OTHER PUBLICATIONS

Lumiflon Product Data Sheet: Lumiflon LF-916F Solid Resin, AGC Chemicals Americas, Inc., www.lumiflonusa.com, 3 pages.
Lumiflon LF-710F Resin Product Data Sheet, AGC Chemicals Americas, Inc., 2 pages.
Acetoacetoxyethyl Methacrylate (AAEM) Acetoacetyl Chemistry, Eastman, Dec. 1999, 12 pages.

* cited by examiner

*Primary Examiner* — Thanh V Pham
(74) *Attorney, Agent, or Firm* — Hovey Williams LLP

(57) ABSTRACT

Planarization methods and microelectronic structures formed therefrom are disclosed. The methods and structures use planarization materials comprising fluorinated compounds or acetoacetylated compounds. The materials are self-leveling and achieve planarization over topography without the use of etching, contact planarization, chemical mechanical polishing, or other conventional planarization techniques.

27 Claims, 10 Drawing Sheets

Resolution: 5x20μm lines     Resolution: 5x5 squares

SELF-LEVELING PLANARIZATION MATERIALS FOR MICROELECTRONIC TOPOGRAPHY

CROSS-REFERENCE TO RELATED APPLICATIONS

The present application claims the priority benefit of U.S. Provisional Patent Application Ser. No. 61/556,879, filed Nov. 8, 2011, entitled SELF-LEVELING PLANARIZATION MATERIALS FOR MICROELECTRONIC TOPOGRAPHY, incorporated by reference in its entirety herein.

BACKGROUND

1. Field of the Invention

The present disclosure relates to planarization materials for microelectronic and microelectromechanical electronics manufacture.

2. Description of Related Art

Advanced integrated circuit (IC) designs are highly dependent on complex device-layering techniques to produce semiconductor devices that are more powerful, have lower profiles, and require less energy to operate. To make these qualities possible, more circuits with much finer structures must be integrated into a microchip by constructing multiple layers of interconnects and dielectrics on a semiconductor substrate in an appropriate sequence. Currently, photolithography is the predominant technique used to pattern these ultrafine structures. This technique requires materials to be deposited and removed from the surface to construct such ultrafine structures.

Photolithography involves depositing a photosensitive material, usually a photoresist, onto a semiconductor substrate surface. An optical transparent object, known as the photomask or reticle, with pre-defined images of the structures to be built on the semiconductor surface is placed above the photoresist-coated substrate. An appropriate wavelength of light is then illuminated through the optical object. The light either decomposes or cures the exposed area of the photoresist, depending on the nature of the photoresist and the process. The semiconductor surface is then developed to produce the patterned image on the substrate surface, and the procedure is then repeated for additional layers.

Materials can be applied in a uniform thickness if the surface to be treated is entirely planar. However, if the surface is not planar, materials may not coat with a uniform thickness. For example, a coating deposited on top of a topographic surface tends to contour to the topography of the underlying surface, thus producing a conformal, non-planar surface. As more layers are built on the surface, the severity of the surface topography increases. Moreover, at some point of applying successive layers of structure to a non-uniform surface of an IC, the non-planar surface becomes unsuitable for constructing the next structural layer. Unfortunately, non-planar surfaces reduce the final yield and performance of IC devices. Therefore, the topographic surface of the IC must be planarized, or flattened, prior to the construction of the next layer. To planarize the topographic surface, techniques such as wet or dry etching, chemical mechanical polishing (CMP), and contact planarization (CP) can be used.

As the feature sizes of microelectronic structures shrink, planarization of the structures becomes increasingly difficult. The width of the structures decreases at a faster rate than the height, due to material and photolithography limitations. This causes the aspect ratio to increase. As the aspect ratio increases, it becomes more difficult to deposit planarization materials in the spaces between features and to create a non-conformal coating.

In addition to IC manufacture, emerging technology such as microelectromechanical systems (MEMS) increasingly requires planarization techniques. MEMS are constructed using many of the same methods as ICs, such as photolithography and etching steps, but the topographies created can be orders of magnitude greater than those of typical IC structures. Advanced MEMS and packaging applications require deep filling and planarization of a device having high-aspect-ratio (HAR) structures to support further integration.

A number of planarization materials and processing methods have been developed to address the current issues. Currently, thick photoresist is one of the materials being used to planarize extreme topography. However, photoresist is not inherently planarizing and will crosslink, making it difficult to remove cleanly. Benzocyclobutene (BCB), sold as Cyclotene® from Dow Chemical, is also being used to planarize topography. However, BCB is not spin-bowl compatible and requires a dedicated track system for coating and baking. It also contains mesitylene solvent, which is banned in some semiconductor laboratories. Dry films have also been explored to use as planarization materials. However, a need remains in the art for suitable planarizing materials and processes.

SUMMARY

The present disclosure is broadly concerned with methods of forming microelectronic structures. The methods comprise providing a wafer stack, applying a planarization composition to the stack, and heating the planarization composition, thereby allowing the planarization composition to self-level into a planarized layer ready for the application of subsequent layers. The wafer stack comprises a substrate having a surface and a pattern comprising a plurality of features formed in and/or on the substrate surface. Features formed on the substrate surface are defined by respective sidewalls and a top surface, and features formed in the substrate surface are defined by respective sidewalls and a bottom surface. The planarization composition covers the pattern as a non-conformal layer on the stack, and the resulting planarized layer has a substantially planar surface relative to the patterned substrate. The planarization composition is selected from the group consisting of: (A) a composition comprising a fluorinated compound dispersed or dissolved in a solvent system, wherein the compound comprises recurring monomeric units containing respective fluorine moieties and one or more crosslinkable functional groups; and (B) a composition comprising an acetoacetylated compound dispersed or dissolved in a solvent system.

Microelectronic or microelectromechanical structures are also disclosed herein. The structures comprise a substrate having a surface; a pattern comprising a plurality of features formed in and/or on the substrate surface; and a planarized layer overcoating the pattern. The planarized layer has a substantially planar surface relative to the patterned substrate. The features formed on the substrate surface are defined by respective sidewalls and a top surface, and the features formed in the substrate surface are defined by respective sidewalls and a bottom surface. The planarized layer is formed from a planarization composition selected from the group consisting of: (A) a composition comprising a fluorinated compound dispersed or dissolved in a solvent system, wherein the compound comprises recurring monomeric units containing respective fluorine moieties and one or more crosslinkable functional groups; and (B) a composition comprising an acetoacetylated compound dispersed or dissolved in a solvent system.

DETAILED DESCRIPTION

Figure 1:
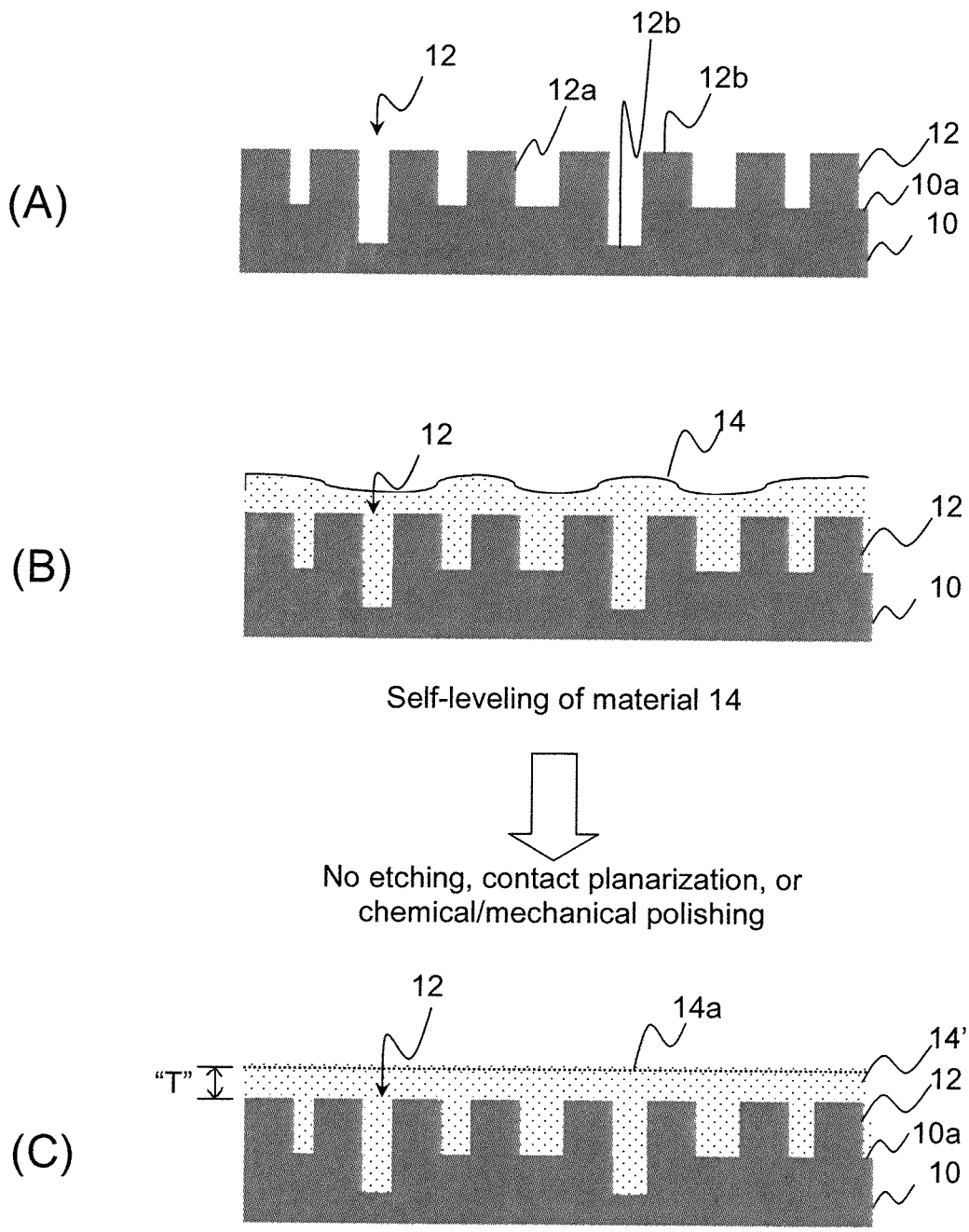
FIG. 1 is a schematic representation of methods according to embodiments of the invention.

In more detail, the present disclosure is concerned with methods and materials for planarizing non-planar microelectronic and/or MEMS substrates. A preferred embodiment of the present invention is described in detail below with reference to FIGS. 1(A)-(C). While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not intended to illustrate the precise shape of a region of a device and are not intended to limit the scope of the present invention, unless otherwise indicated.

Planarization Methods

With reference to FIG. 1(A), a substrate 10 having a surface 10a is provided. The substrate 10 can be any conventional microelectronic or microelectromechanical substrate, which is defined herein as a support substrate having miniature (micrometer-sized or smaller) structures formed in or thereon and used in creating various devices, including microelectronic, microelectromechanical, LED, and/or solar devices. In some cases, many individual devices are made together on one substrate and then separated toward the end of fabrication. For electronic applications, semiconducting substrates (e.g., silicon) can be used. For optical devices or flat panel displays, transparent substrates (e.g., glass or quartz) are common. Preferred substrates include those selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, quartz, $Ti_3N_4$, hafnium, $HfO_2$, ruthenium, indium phosphide, GaN, and mixtures of the foregoing.

As noted above, the substrate 10 is patterned and includes various structures or features 12 formed in (recessed features) and/or on (raised features) the substrate surface 10a. These features 12 are each defined by respective sidewalls 12a and respective top (or bottom) surfaces 12b. In other words, the substrate 10 is non-planar and may include varying topography and feature sizes, depending upon the final intended use of the substrate 10. As used herein, "topography" refers to the height or depth of a structure 12 as measured from the top or bottom surface 12b (as applicable) to the substrate surface 10a, while "feature size" refers to the width and length (or in the case of substantially circular features, the diameter) of a structure 12 as measured between the sidewalls 12a. If the width and length are different for a given structure 12, it is conventional to reference the smaller number as the designated "feature size" of that structure 12. The feature size and topography are typically measured using an SEM cross-section image of the patterned substrate 10. The average (mean) feature size of the structures 12 in and/or on the substrate surface will preferably be less than about 500 µm, more preferably from about 0.1 µm to about 500 µm, even more preferably from about 10 µm to about 200 µm, and most preferably from about 1 µm to about 100 µm.

It will be appreciated that the features 12 may be formed or created using any suitable process or patterning method, or combination of processes, such as traditional photolithography, immersion lithography, imprint lithography, nano-imprint lithography, hot embossing lithography, and stamping pattern transfer, metallization, directed self-assembly (DSA), and the like. Exemplary features 12 that may be formed in or on the substrate include vias (including TSVs), holes (including contact holes, microfluidic chip channels, ink-jet nozzle channels, MEMS cap holes), trenches (including dicing lanes), cavities, pillars, posts, lines, bumps, cubes, and/or chips. Respective features 12 may be formed of the same or different materials and can be created from single or multiple layers. In other words, it will be appreciated that formation of the topographical features 12 may involve deposition (and in some cases selective removal) of various thin films (e.g., layers of lithography compositions) or other materials (e.g., metal wires, dielectrics, etc.). Exemplary lithography compositions include anti-reflective coatings, spin-on carbon, photoresists, hardmasks, and the like.

Regardless of the pattern formed in or on the substrate 10, a planarization composition 14 can then be applied to the non-planar substrate 10, as shown in FIG. 1(B). The planarization composition 14 forms a non-conformal layer over the patterned substrate 10, such that the composition 14 is adjacent the substrate surface 10a between features 12, and is in contact with the top (and/or bottom) surfaces and sidewalls of the features. The planarization material 14 will fill in the recessed features 12 formed in the substrate surface 10a and/or overcoat the top surfaces 12b of the raised features 12 formed on the substrate surface 10a. Suitable planarization materials 14 include those compositions discussed in more detail herein. The planarization composition 14 can be applied using any suitable technique, including spin coating, spray coating, and the like. In some embodiments, the composition 14 is applied via spin coating at speeds of from about 50 rpm to about 5,000 rpm, preferably from about 100 rpm to about 2,000 rpm, and for time periods of from about 3 seconds to about 300 seconds, preferably from about 10 seconds to about 120 seconds. The planarization composition 14 can then be heated (e.g., baked) to a temperature sufficient to drive off solvents (if applicable), allow reflow, effect curing, and/or cause thermal crosslinking of the composition. Baking temperatures will typically range from about 40° C. to about 300° C., preferably from about 80° C. to about 250° C., and more preferably from about 100° C. to about 205° C. Suitable planarization materials will typically remain liquid or have sufficiently low viscosity after solvent evaporation at elevated temperatures to self-level over the features, without being tacky when cooled to room temperature. However, they must also have a sufficiently high degradation temperature to remain stable during subsequent downstream processing, which can involve extreme temperatures. In some embodiments, the planarization composition 14 can be subjected to one or more additional heating steps to allow further reflow of the composition into and over features after solvent evaporation. Such additional heating steps will typically be carried out at temperatures above the initial heating temperature, for example, from about 60° C. to about 350° C., and preferably from about 90° C. to about 300° C. In some embodiments, the planarization composition 14 can also be cured or crosslinked via exposure to light (e.g., DUV, i-line, g-line, and/or broad band) in addition to, or in lieu of, heating.

The exact planarization conditions will depend upon the particular planarization material 14 used, and will result in a dried, cured, and/or crosslinked planarization layer 14'. In some embodiments, this process can be repeated to form multiple coats of the planarization composition 14 over the features 12 and achieve planarization. In any event, as shown in FIG. 1(C), the planarization composition 14 self-levels or self-planarizes into a dried, cured, and/or crosslinked layer 14' without being contacted with a flat surface (e.g., optical flat), wet or dry etchant, or any other mechanical or chemical influence. In other words, no etching (wet or dry), contact planarization, or polishing occurs in the method to achieve the planarized layer 14', which is directly ready for the application of subsequent layers or further processing without any intervening planarization techniques. Such planarization techniques are not required, as the material is capable of efficient self-planarization. In other words, the composition self-planarizes or self-levels (during baking) within less than about 60 minutes, preferably from about 1 to about 20 minutes, and more preferably from about 5 to about 10 minutes after application.

The average thickness "T" of the planarized layer 14' over the features 12 is from about 0 μm to about 200 μM, preferably from about 0 μm to about 10 μm, and more preferably from about 0.1 μm to about 2 μm. As depicted in FIG. 1(C), the thickness "T" is measured from the top surface 12b of the highest feature 12 of the patterned substrate 10 (where a thickness "T" of about 0 μm indicates that the planarized layer 14' is level with the highest feature). The "highest" feature 12 is a raised feature formed on the substrate surface 10a, whose top surface 12b is further from the substrate surface 10a, than the respective top surfaces 12b of any other raised topographical feature on the substrate 10. In other words, when viewed as an SEM cross-section, the "highest" feature 12 is the tallest feature on the substrate 10. Likewise, the "deepest" feature 12 is one formed in the substrate surface 10a, whose bottom surface 12b is further from the substrate surface 10a, than the respective bottom surfaces 12b of any other feature in the substrate 10. The thickness "T" of the planarized layer 14' over the features 12 is preferably substantially uniform (i.e., has little variation), such that local planarity (and preferably global planarity) is achieved. In particular, the thickness "T" preferably varies by less than about 20%, preferably by less than about 10%, and more preferably by less than about 3% over a distance of about 10,000 μm across the substrate 10.

In some embodiments, the planarized layer 14' remains soluble in solvents. In some embodiments, the planarized layer 14' is photoresist-compatible, and substantially insoluble in photoresist solvents, such as ethyl lactate (EL), propylene glycol monomethyl ether (PGME), and propylene glycol methyl ether acetate (PGMEA). Thus, when subjected to a stripping test, the planarized layer 14' will have a percent stripping of less than about 5%, preferably less than about 1%, and even more preferably about 0%. The stripping test involves first determining the thickness (by taking the average of measurements at five different locations) of the planarized layer 14'. This is the average initial film thickness. Next, EL is puddled onto the dried, cured, and/or crosslinked film for about 20 seconds, followed by spin drying at about 3,000 rpm for about 30 seconds to remove the solvent. The thickness is measured again at five different points on the wafer using ellipsometry, and the average of these measurements is determined. This is the average final film thickness. The amount of stripping is the difference between the initial and final average film thicknesses. The percent stripping is:

$$\% \text{ stripping} = \left(\frac{\text{amount of stripping}}{\text{initial average film thickness}}\right) \times 100.$$

In some embodiments, the planarized layer 14' will also be insoluble in photoresist developers, such as tetramethylammonium hydroxide (TMAH) and/or potassium hydroxide (KOH). In other embodiments, the planarized layer 14' will be soluble in photoresist developers. The solubility of the planarized layer 14' in developer is evaluated using the same procedure and calculation as that for the stripping test described above, except that instead of a photoresist solvent (EL), a developer is used. For example, 0.26 N TMAH developer is puddled onto the layer for 45 seconds, followed by a 5-second deionized water rinse, and a spin dry. Any loss of thickness in the planarized layer 14' is defined as the "dark loss." In some embodiments, the planarized layer 14' will have a dark loss of less than about 5%, preferably less than about 1.5%, more preferably less than about 1%, even more preferably less than about 0.8%, and most preferably about 0%. In other embodiments, the planarized layer 14' will have a dark loss of at least about 85%, preferably at least about 95%, and more preferably at least about 99%.

In some embodiments, the planarized layer 14' is initially insoluble in developer or solvent, but can be rendered developer-soluble upon exposure to radiation of the appropriate wavelength or heat. In other embodiments, the planarized layer 14' is initially soluble in developer or solvent, but can be rendered insoluble upon exposure to radiation or heat. In other words, certain embodiments relate to either positive- or negative-working photosensitive planarization materials that can be patterned. In some embodiments, the planarized layer 14' can be patterned to a resolution of from about 1 µm to about 100 µm, preferably from about 1 µm to about 20 µM, and more preferably from about 5 µm to about 10 µm.

The planarized layer 14' will be resistant to typical harsh chemicals and etchants that can be encountered during downstream microfabrication, such as acid etch, chemical vapor deposition (CVD), and the like. The planarized layer 14' will also have a high degradation temperature (i.e., decomposition temperature) of at least about 150° C. and preferably between about 200° C. and 300° C. In some embodiments, the planarized layer 14' forms a temporary planarization layer that is later removable from the structure. In other embodiments, the planarized layer 14' is a permanent component of the structure.

The embodiments described herein are particularly suited for planarizing high aspect ratio features and large and deep features. The "aspect ratio" is the depth or height of a feature, divided by the width of the feature (as measured using an SEM cross-section image). A "high" aspect ratio indicates that a feature is narrow relative to its height or depth (e.g., aspect ratio of 10:1 or 20:1), or one that is wide relative to its height of depth. Examples of high aspect ratio features include contact holes or trenches that are narrow relative to their depth (narrow and deep), metal lines that are thin relative to their height (thin and tall), or trenches that are wide relative to their depth (very wide and shallow). As discussed in more detail below, the planarization materials are capable of filling voids and spaces between high aspect ratio features 12, even in dense arrays, to planarize the substrate 10.

The resulting planarized stack can be subjected to further processing as appropriate (not shown). For example, a photoresist composition can be applied to the dried, cured, and/or crosslinked planarized layer 14' to form an imaging layer (not shown). In some embodiments, one or more intermediate layers can first be formed on the dried, cured, and/or crosslinked planarized layer 14', such as anti-reflective coatings. Regardless, the imaging layer is then preferably post-application baked (PAB) at a suitable temperature and time (e.g., at least about 95° C., preferably from about 100° C. to about 135° C., and more preferably from about 100° C. to about 130° C., for time periods of from about 45 seconds to about 75 seconds). It will be appreciated that the thickness of the imaging layer can range from about 50 nm to about 2,000 nm. Preferably, the thickness of the imaging layer is from about 100 nm to about 250 nm, more preferably from about 120 nm to about 240 nm, even more preferably from about 130 nm to about 230, and most preferably from about 170 to about 225 nm. Suitable imaging compositions include commercially-available photoresists (e.g., TarF-Pi6-001 from TOK, Kawasaki shi, Kanagawa (Japan); ARX3001JN, ARX3340J, and AM2073J, from JSR Micro, Sunnyvale, Calif.; SAIL-X-181, Shin-Etsu, Tokyo (Japan)), or any other photosensitive compositions. Due to the planarized layer 14', the thickness of the imaging layer (or other subsequent layer) will be substantially uniform, despite the presence of topography on the substrate.

The imaging layer can then be patterned by exposure to light of the appropriate wavelength, followed by development of the exposed or unexposed portion of the photoresist (depending upon whether positive- or negative-acting). In some embodiments, the dried, cured, and/or crosslinked planarized layer 14' can also be photosensitive. Thus, exposure to light also patterns the planarized layer 14', for example, by decrosslinking or deprotecting exposed portions rendering them soluble in developer or solvent, or by crosslinking the exposed portions leaving the unexposed portions soluble in developer or solvent. The exposed (or unexposed, as the case may be) portions of the planarized layer 14' underneath the exposed (or unexposed) portions of the imaging layer are removed by the developer or solvent as the imaging layer is removed, so as to simultaneously form the desired pattern. The resulting pattern can then be transferred into any underlayers. In some embodiments, the pattern can be transferred by etching the imaging layer pattern into the planarized layer 14'.

It will be appreciated that in some embodiments, a photosensitive planarized layer 14' may be used alone, in lieu of a photoresist, to create the desired pattern. Thus, the patterning process described above would be carried out using the photosensitive planarized layer 14' as the imaging layer, which is directly exposed to radiation and removed using developer or solvent, as appropriate. The photoimageable planarized layer 14' greatly reduces the number of process steps required and therefore substantially increases yield, while reducing production costs. It will also replace the conventional dual-layer gap-fill and photoresist system with a single layer.

As noted above, depending upon the embodiment, the planarized layer 14' can be either a temporary or permanent component of the resulting structure. When necessary, the planarized layer 14' can be easily removed from the substrate using conventional solvents, such as PGME, PGEMA, or photoresist developers for easy clean-up after processing. Preferred planarization materials for use in the above methods are described below.

Figure 13:
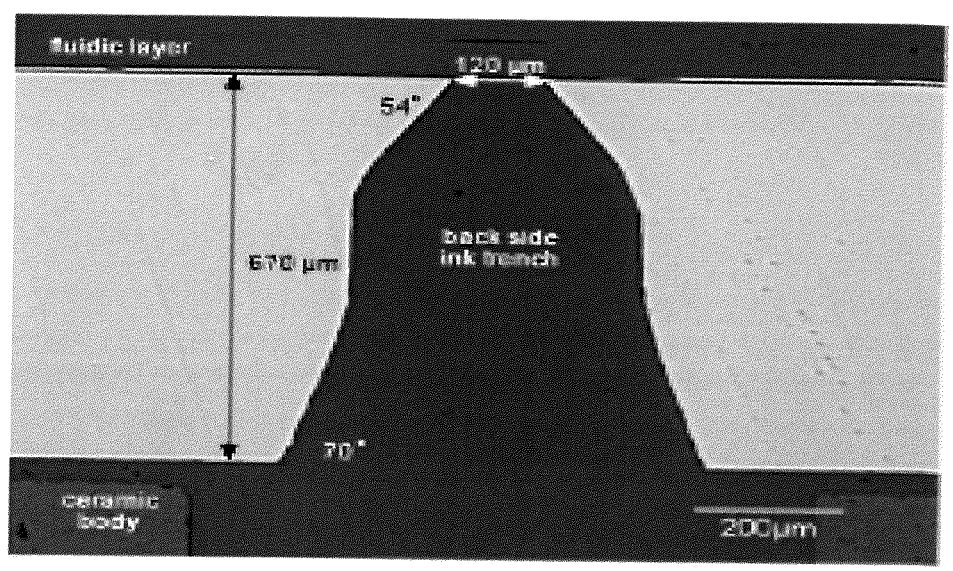
FIG. 13 illustrates use of a planarization material to fill the cavity for an ink jet MEMS.
Figure 14:
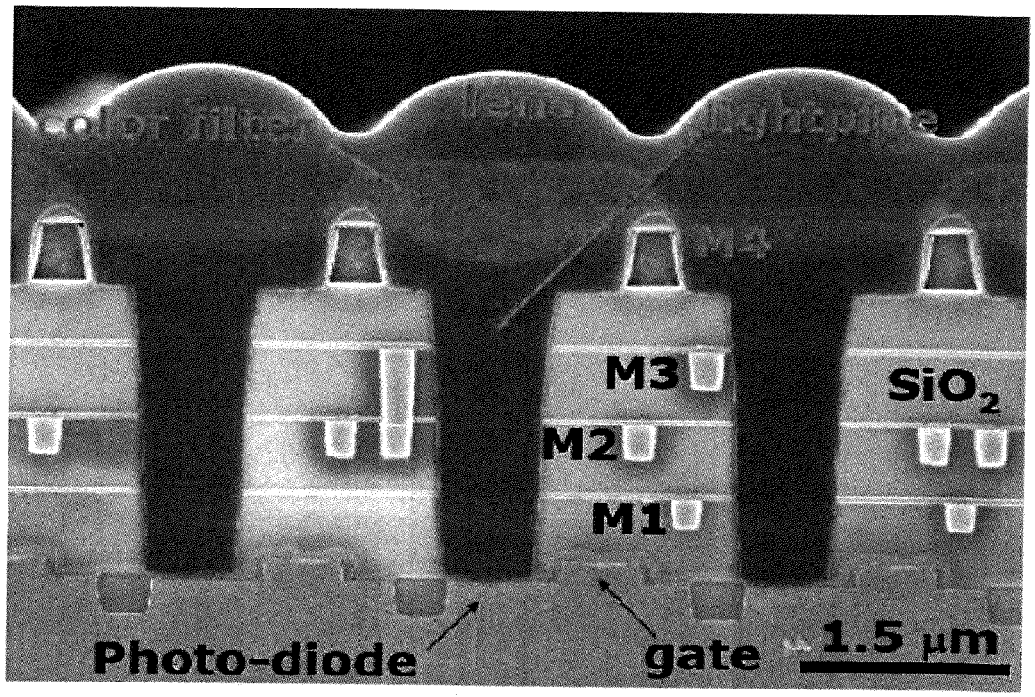
FIG. 14 is an image of a CMOS image sensor to illustrate how a planarization layer can be useful to flatten the surface for microlens placement.
Figure 15:
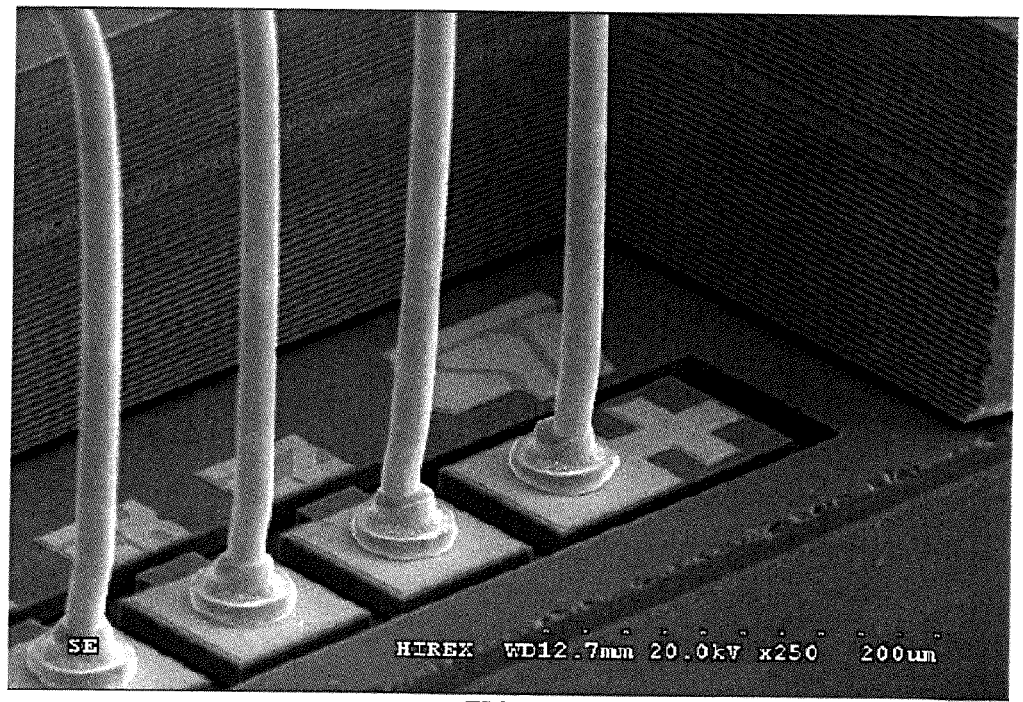
FIG. 15 is an image showing a MEMS cap plus wire-bond pad to illustrate that a planarization layer can be useful between the pads to support the structure.
Figure 16:
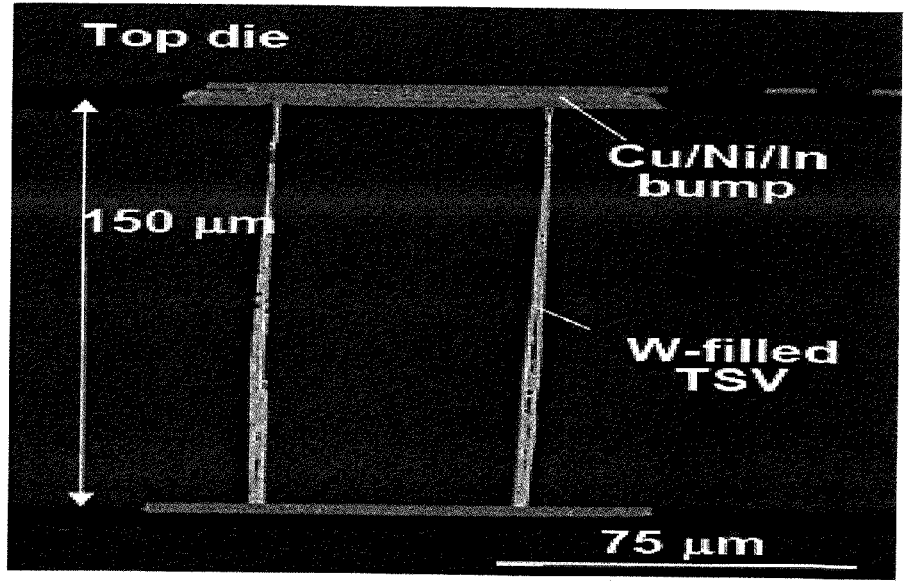
FIG. 16 is an image showing a silicon interposer through-silicon via (TSV) to illustrate that a planarization layer can be used to save money on metal costs.
Figure 17:
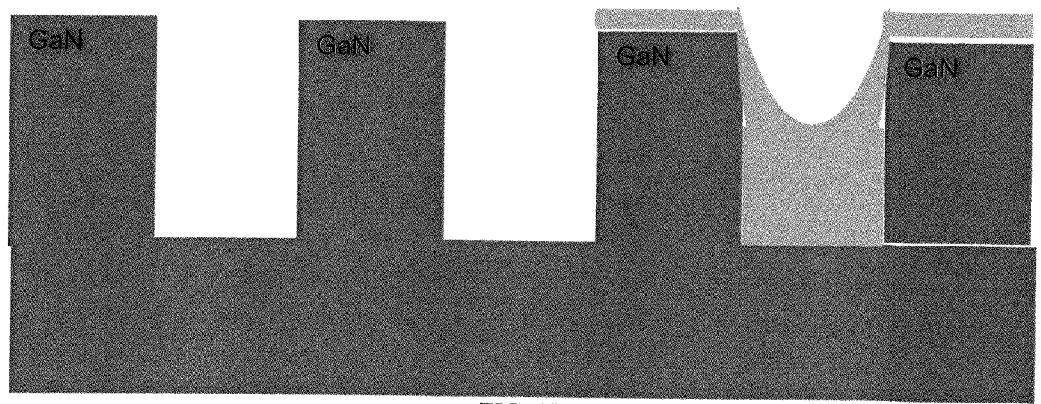
FIG. 17 illustrates the use of a planarization material as an isolation layer between devices.
Figure 18:
FIG. 18 illustrates the use of a planarization material to support the transfer of chips to dicing tape.
Figure 19:
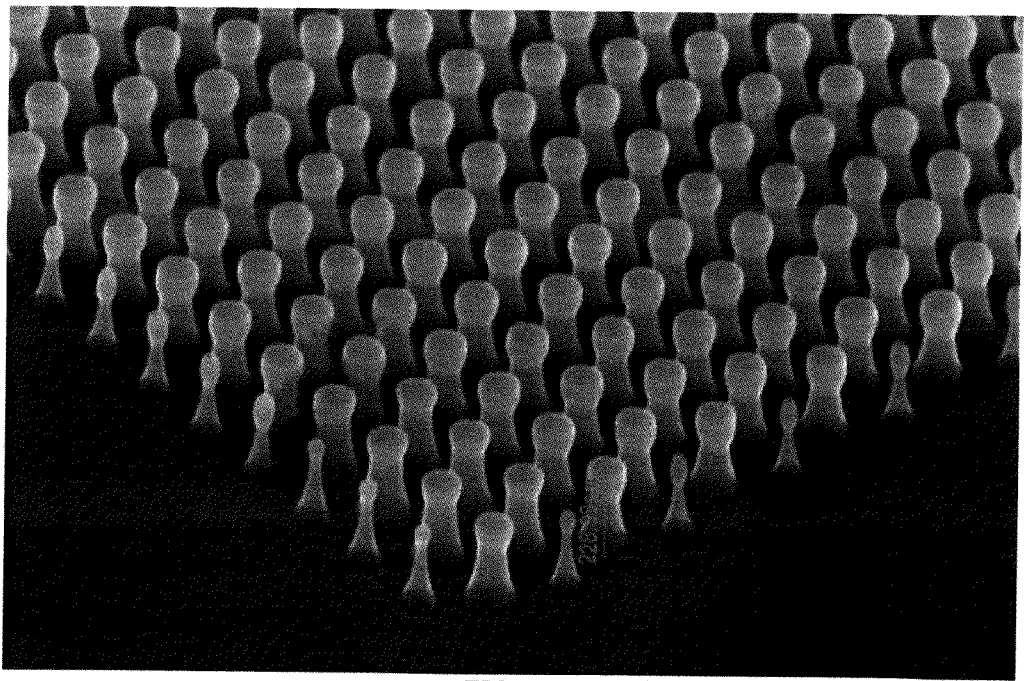
FIG. 19 is an image of a solar cell surface to illustrate how a planarization layer can be used to smooth the raised features on the surface for subsequent processing.
Figure 20:
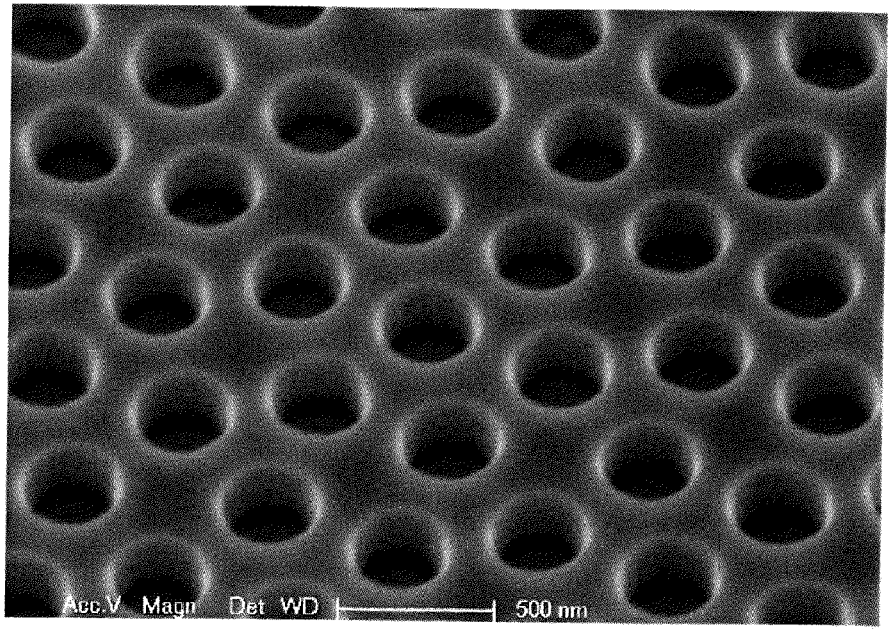
FIG. 20 is an image of a photonic crystal array in an LED substrate to illustrate how a planarization layer can be used to smooth the cavities in the surface for subsequent processing.

The various embodiments described herein provide self-leveling planarization materials that are stable at high temperatures and which are useful in a variety of microelectronic industries, such as MEMS, CMOS imaging sensors, LEDs, solar, digital light processor (DLP), ink-jet (FIGS. 13), and 3-D advanced packaging. Those skilled in the art will appreciate that such materials not only improve photoresist performance, but enable uniform and stable microlens placement in CIS applications (FIG. 14), achieve better resolution and intensity for DLP by filling center holes to increase light intensity, support MEMS cap structures (FIG. 15), reduce costs for interposers in 3-D advanced packaging (FIG. 16), provide an isolation layer between two components on the same die or wafer (FIG. 17), improve efficiency in the process of releasing dies from a carrier wafer (FIG. 18), improve light capture in solar cell applications (FIG. 19), and provide an optically clear smooth surface on flexible or rigid substrates in organic LEDs (OLEDs)(FIG. 20).

Planarization Compositions

In some embodiments, the planarization compositions are based upon a fluoropolymer platform, which offers excellent chemical and physical stability, particularly for use as a permanent planarizing material in crosslinked embodiments. In some embodiments, an acetoacetylated compound is utilized, which allows for good flow properties, and can be used to formulate both positive- or negative-acting compositions. Because the planarization needs for individual structures can vary, it is advantageous to have tunable planarization materials for different needs. Those skilled in the art will recognize that many aspects of the formulations can be varied to achieved the desired level of planarization, such as polymer or monomer ratios, diluents, solvent ratios, surfactants, and other additives. Processing parameters can also be varied, such as spin-coating speed, number of coats, baking temperatures, and curing methods. Non-limiting examples of such variations are described below.

Fluorinated Compound Platform

In some embodiments, the planarization composition comprises a fluorinated compound dispersed or dissolved in a solvent system. Unlike many other fluorinated compounds, suitable compounds for the invention will be readily soluble (≥80%) in common polar solvents. In some embodiments, the compounds are also insoluble in water or base developer. Suitable solvent systems will include one or more solvents selected from the group consisting of PGME, PGMEA, cyclic ketones (e.g., cyclopentanone), EL, gamma butyl lactone (GBL), dimethylacetamide, and mixtures thereof. The compound is an oligomer, polymer, or mixture thereof comprising recurring monomeric units containing respective fluorine moieties and one or more pendant crosslinkable functional groups, such as free hydroxy groups, carboxylic acids, esters, phenols, epoxy groups, or combinations thereof. It will be appreciated that the fluorine moieties and crosslinkable groups may be on the same or different monomeric unit. The fluorine moieties can be included in the compound as part of the backbone or pendant therefrom. The compound preferably has a low weight average molecular weight (Mw) of less than about 50,000 Daltons, preferably less than about 10,000 Daltons, and more preferably from about 1,000 to about 6,000 Daltons.

In some embodiments, the compound is a copolymer (or heteropolymer) of fluorinated ethylenically unsaturated monomers and one or more other copolymerizable ethylenically unsaturated monomers. Exemplary fluorinated ethylenically unsaturated monomers include fluoroethylene, difluoroethylene, trifluoroethylene, tetrafluoroethylene, and chlorotrifluoroethylene. Examples of "other" copolymerizable ethylenically unsaturated monomers suitable for use in the invention include ester-, ether-, acrylate-, methacrylate-, or crosslinkable functional group-containing monomers, such as cyclohexyl vinylether, ethyl vinyl ether, butyl vinyl ether, vinyl acetate, vinyl propionate, vinyl pivalate, vinyl caproate, vinyl versatate, hydroxyethyl vinyl ether, hydroxypropyl vinyl ether, hydroxybutyl vinyl ether, glycidyl methacrylate, methacrylate, ethyl acrylate, 1,1,1,3,3,3-hexafluoroisopropyl acrylate, methyl methacrylate, butyl methacrylate, and the like.

In some embodiments, the molar ratio of fluorinated monomer to other co-monomers in the compound is preferably from about 1:10 to about 1:1, more preferably from about 1:8 to about 1:3, and even more preferably from about 1:5 to about 1:2. It will be appreciated that the properties of the resulting copolymer can be varied by changing the monomer ratios, initiator amount, and process conditions such as reaction temperatures. Such modifications can be used to vary the Mw, solution and melt viscosities, glass transition temperatures and the development rate of the material in solvent.

Figure 2:
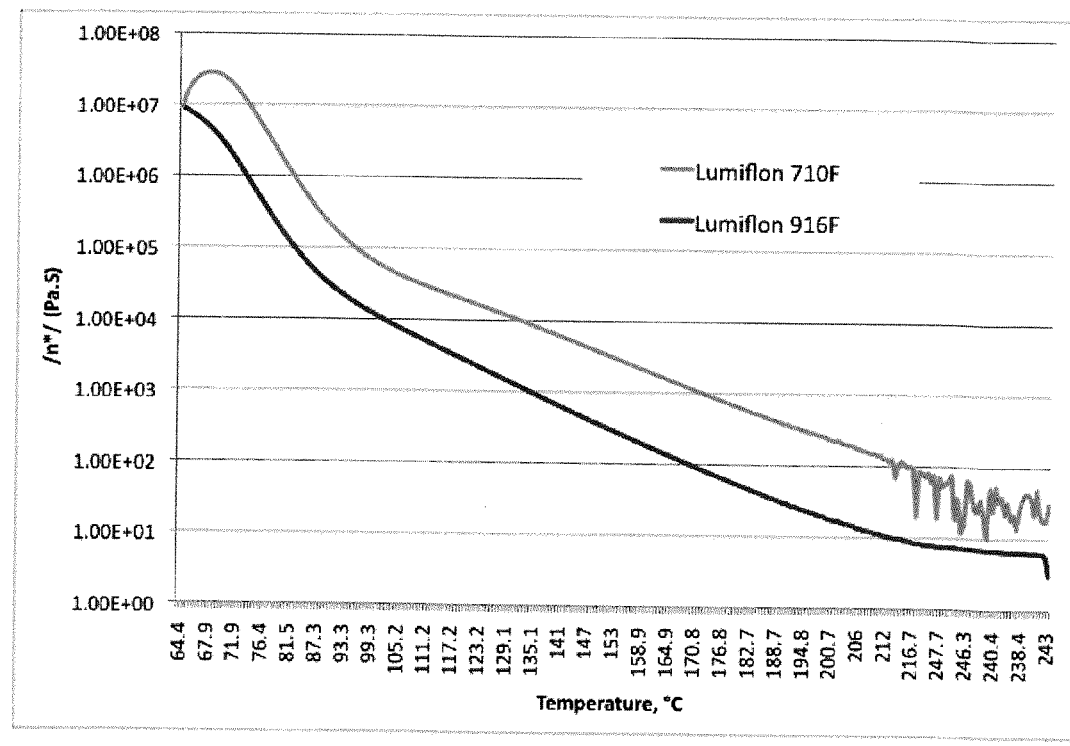
FIG. 2 is a graph of the rheology of LUMIFLON® 710F and 916F.

The compound can be prepared by polymerizing suitable monomers described above. Suitable fluorinated compounds are also commercially available under the tradename, LUMIFLON® (Ashahi Glass). LUMIFLON® polymers contain alternating segments of fluoroethylene and alky vinyl ether, and include a hydroxy component available for crosslinking. LUMIFLON® 710F and 916F are up to 80% soluble in many common organic solvents and can be coated at a thickness of up to about 80 μm. Rheology tests indicated that LUMIFLON®-based formulations have a quick drop in viscosity after they reach temperatures higher than their Tg (FIG. 2). The contact angles of LUMIFLON® formulations are also about 82-87° with water.

The fluorinated compound is preferably present in the composition at a level of from about 1% to about 80% by weight, more preferably from about 10% to about 60% by weight, and even more preferably from about 20% to about 50% by weight, based upon the total weight of the composition taken as 100% by weight. The solvent system is preferably present at a level of from about 20% to about 99% by weight, more preferably from about 40% to about 90% by weight, and even more preferably from about 50% to about 80% by weight, based upon the total weight of the composition taken as 100% by weight. The total solids in the composition can range from about 1% to about 80% by weight, preferably from about 10% to about 60% by weight, and more preferably from about 20% to about 50% by weight, based upon the total weight of the composition taken as 100% by weight.

The composition preferably has a Brookfield viscosity of from about 1 cps to about 1,000 cps, more preferably from about 10 cps to about 500 cps, and even more preferably from about 20 cps to about 2,000 cps at 37.8° C. After application to a substrate, suitable fluorine-based compositions will able to reflow by applying low heat (e.g., about 60-150° C.) to facilitate filling of gaps, spaces, and trenches on the patterned substrate, as discussed above, as well as self-leveling. The fluorinated compounds will also have high temperature stability (315° C. in air).

The composition can further comprise one or more additives to adjust the desired properties of the fluorinated planarization material. In some embodiments, the composition further comprises a crosslinking agent, such as amino crosslinkers (e.g., CYMEL® 303 LF, CYMEL® 1170, or Powderlink 1174). When present, the composition comprises from about 1% to about 30% by weight crosslinking agent, preferably from about 3% to about 15% by weight crosslinking agent, and more preferably from about 5% to about 10% by weight crosslinking agent, based upon the total weight of the total solids in the composition taken as 100% by weight. In some embodiments, the composition further comprises an acid generator, such as a photoacid generator (PAG) and/or thermal acid generator (TAG). Acid generators can facilitate curing of the composition. When present, the composition comprises from about 0.1% to about 3% by weight TAG, preferably from about 0.3% to about 1.5% by weight TAG, and more preferably from about 0.5% to about 1% by weight TAG, based upon the total solids in the composition taken as 100% by weight. When present, the composition comprises from about 0.1% to about 10% by weight PAG, preferably from about 0.3% to about 5% by weight PAG, and more preferably from about 0.5% to about 1% by weight PAG, based upon the total weight of the total solids in the composition taken as 100% by weight.

Additional additives that may be used in the compositions include surfactants, plasticizers, and the like. In some embodiments, the compositions are substantially free of pigments, dyes, plasticizers, and/or surfactants. The term "substantially free" means that the ingredient is not intentionally added to the composition, although incidental impurities may occur, such that the composition comprises less than about 0.5% by weight, preferably less than about 0.1%, and more preferably about 0% by weight of such an ingredient, based upon the total weight of the composition taken as 100% by weight. In some embodiments, the composition consists essentially, or even consists, of the fluorinated compound dispersed or dissolved in a solvent system, optionally along with a crosslinking agent, and/or an acid generator. In some embodiments, the composition is substantially free of crosslinking agent and/or acid generator.

Depending on the additives, the fluorine-based planarization compositions can be cured by heat and/or light exposure. Dried fluorine-based planarization compositions will remain soluble in solvent to create removable planarized layers, unless crosslinked. Photosensitive formulations can be used to create patterned layers by exposure to light, followed by removal of the unexposed (uncrosslinked) portions. Crosslinked fluorine-based planarization layers are insoluble in solvent or developer, but can be removed via reactive ion etching. Due to their high thermal stability, such layers are particularly suited for permanent planarization layers. Planarization layers formed from the fluorinated compound will have a low surface energy/high contact angle (about 80° to about 88° with water, and preferably about 87° with water). The fluorine-based planarization layers will also have a relatively low refractive index of from about 1.4 to about 1.5, preferably from about 1.42 to about 1.48, and more preferably about 1.47 at 589 nm. The fluorine-based planarization layers will have an extended optical clarity (% light transmittance) of at least about 80%, preferably at least about 85%, and more preferably greater than about 90% transmission at wavelengths ranging from 300 nm to 3,300 nm.

Acetoacetylated Copolymer Platform

In some embodiments, the planarization composition comprises an acetoacetylated compound dispersed or dissolved in a solvent system. Suitable solvent systems will include one or more solvents selected from the group consisting of PGME, PGMEA, ethyl acetoacetate (EAA), EL, ethyl 3-ethoxypropionate (EEP), ketones (e.g., acetone), and mixtures thereof. Acetoacetylated compounds can be prepared by polymerizing acetoacetylated monomers into the polymer chain, or by acetoacetylating the polymer after initial synthesis. AAEM-containing copolymers can be synthesized using procedures known in the art, including those described in "Acetoacetoxyethyl Methacrylate (AAEM) Acetoacetyl Chemistry" from Eastman Chemical Company. Suitable initiators that may be used in copolymer synthesis include, without limitation, azo-bisisobutyronitrile (AIBN) and azobismethylbutyronitrile (e.g., VAZO® 67, azobis(2-methylbutyronitrile)).

A preferred acetoacetylated starting monomer is acetoacetoxyethyl methacrylate (AAEM). In some embodiments the acetoacetylated compound comprise acetoacetoxyethyl pendant groups. In some embodiments, the compound comprises recurring monomeric units of formula (I):

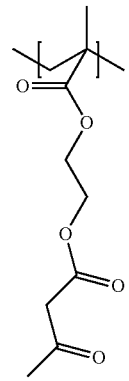

(I)

In some embodiments, the compound is a copolymer (or heteropolymer) comprising recurrently monomeric units of the acetoacetylated monomer of formula (I) with one or more additional copolymerizable monomers. Suitable copolymerizable monomers include acrylate-, methacrylate-, and styrene-containing monomers. In some embodiments, the compound is a copolymer (or heteropolymer) of formula (I) and a methyl methacrylate monomer. Other suitable co-monomers include 4-tert-butoxycarbonyloxystyrene (t-BOC-styrene), t-butyl methacrylate, styrene, glycidyl methacrylate, and the like. The compound preferably has a molecular weight (Mw) of less than about 30,000 Daltons, preferably less than about 15,000 Daltons, and more preferably from about 1,000 to about 13,000 Daltons.

In some embodiments, the molar ratio of acetoacetylated monomer to other (non-acetoacetylated) co-monomers in the compound is preferably from about 99:1 to about 1:99, more preferably from about 80:20 to about 50:50, and even more preferably from about 70:30 to about 60:40. It will be appreciated that the properties of the resulting copolymer can be varied by changing the monomer ratios, initiator amount, and process conditions such as reaction temperatures. Such modifications can be used to vary the Mw, solution and melt viscosities, glass transition temperatures and the development rate of the material in TMAH aqueous solution.

In some embodiments, further monomers can be copolymerized with the acetoacetylated monomer to obtain desired properties in the resulting heteropolymer. For example, the acetoacetylated monomer can be copolymerized with methyl methacrylate and n-butyl acrylate to yield a terpolymer with increased thermal stability. In particular, such a terpolymer has a higher thermal decomposition temperature (Td) (~210° C.) than that of a AAEM/MMA copolymer. Increased thermal stability can broaden the application window of the planarizing material. Other additional monomers that can be used with AAEM include methyl acrylate, ethyl acrylate, and the like.

The acetoacetylated compound is preferably present in the composition at a level of from about 1% to about 90% by weight, more preferably from about 10% to about 80% by weight, and even more preferably from about 15% to about 50% by weight, based upon the total weight of the composition taken as 100% by weight. When present, the solvent system is preferably present at a level of from about 10% to about 99% by weight, more preferably from about 20% to about 90% by weight, and even more preferably from about 50% to about 85% by weight, based upon the total weight of the composition taken as 100% by weight. The total solids in the composition can range from about 1% to about 90% by weight, preferably from about 10% to about 80% by weight, and more preferably from about 15% to about 50% by weight, based upon the total weight of the composition taken as 100% by weight. High solids content is preferred in some structure filling applications since it will reduce the amount of solvent to be removed and provide the planar surface. However, in some embodiments a certain level of solvent is desired to achieve the preferred viscosity.

The composition preferably has a Brookfield viscosity of from about 1 cps to about 5,000 cps, more preferably from about 10 cps to about 500 cps, and even more preferably from about 20 cps to about 200 cps at 37.8° C. It will be appreciated that the viscosity can be modified by changing the amount of solvent.

The composition can further comprise one or more additives to adjust the desired properties of the acetoacetylated planarization material. In some embodiments, the composition further comprises a crosslinking agent, such as amino crosslinkers (e.g., CYMEL® 303 LF, CYMEL® 1170, or Powderlink 1174). Those skilled in the art will appreciate that the acetoacetylated compound has two reactive sites for crosslinking, a methylene group and a ketone carbonyl group. In one aspect, crosslinking with amino crosslinkers can occur at the methylene group site, but other crosslinking methods may be used as well. When present, the composition comprises from about 1% to about 30% by weight crosslinking agent, preferably from about 2% to about 20% by weight crosslinking agent, and more preferably from about 3% to about 15% by weight crosslinking agent, based upon the total weight of the solids in the composition taken as 100% by weight.

In some embodiments, the composition further comprises an acid generator, such as a photoacid generator (PAG) and/or thermal acid generator (TAG). Acid generators can facilitate curing of the composition. They can also be used to decrosslink or deprotect the composition in some embodiments. When present, the composition comprises from about 0.1% to about 15% by weight TAG, preferably from about 0.2% to about 10% by weight TAG, and more preferably from about 0.5% to about 5% by weight TAG, based upon the total weight of the solids in the composition taken as 100% by weight. Exemplary TAGs include TAG-2689 by King Industries. When present, the composition comprises from about 0.1% to about 10% by weight PAG, preferably from about 0.2% to about 5% by weight PAG, and more preferably from about 0.5% to about 3% by weight PAG, based upon the total weight of the solids in the composition taken as 100% by weight. Exemplary PAGs include UVI-6976 and UVI-6992 (from Dow Chemical) and the like. It will be appreciated that crosslinkers and can be used in combination with PAGs or TAG (and/or other additives) to generate photosensitivity in the materials and/or to make permanent films. For example, the thermal decomposition temperature (Td) of an AAEM/MMA co-polymer material is about 180° C. (by TGA, ramp at 10° C./min under air). After crosslinking, the Td can be above 250° C., which is suitable for dielectric or adhesive coatings.

Other additives can also be included in the composition, if desired. Additional additives include surfactants, sensitizers, and the like. For example, sensitizers such as 9-anthracenemethanol may be added to the formulation to make an i-line photosensitive material. In some embodiments, the composition is substantially free of surfactants and/or sensitizers. In some embodiments, the composition consists essentially, or even consists, of the acetoacetylated compound dispersed or dissolved in a solvent system, optionally along with a crosslinking agent, and/or an acid generator. In some embodiments, the composition is substantially free of crosslinking agent and/or acid generator.

By copolymerizing with different monomers or varying the additives, positive- or negative-tone photosensitivity can be incorporated into the AAEM-containing self-leveling planarization materials. In one embodiment, planarization materials with negative-tone photosensitivity are provided that comprise an AAEM-containing copolymer (e.g., AAEM/MMA) with amino crosslinker and PAG, dispersed or dissolved in a solvent system. AAEM could also be copolymerized with other monomers such as 4-tert-butoxycarbonyloxystyrene (t-BOC-styrene) or t-butyl methacrylate to make positive-tone photosensitive materials. As discussed above, planarization materials with photosensitivity make it possible to use one material as both the planarization material and imaging layer (photoresist).

After processing, the AAEM-based planarization layer can be removed by solvents such as PGMEA, or by a standard TMAH developer (such as PD523AD). By controlling the Mw and monomer ratio within the copolymer, the development rate of the AAEM-based planarization layer in PD523AD can be controlled between about 1 to about 20 µm/min. (preferably about 3 to about 14 µm/min.). Also, both the uncrosslinked and crosslinked materials have excellent light transparency of greater than about 85%, preferably greater than about 95%, and more preferably greater than about 99% transmittance for a 1-µm film at wavelengths of 400-800 nm.

Additional advantages of the various embodiments of the disclosure will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Fluorine-containing Planarization Material A

In this Example a planarization composition was prepared by mixing 40 grams of a fluoroethylene vinyl ether copolymer (LUMIFLON® 916F solid resin; Asahi Glass, Exton, Pa.) with 60 grams of a 50:50 by weight PGME:PGMEA mixture. The mixture was rotated on a wheel for about 4 hours until fully dissolved. The finished formulation (Material A) was a clear viscous liquid.

Figure 3:
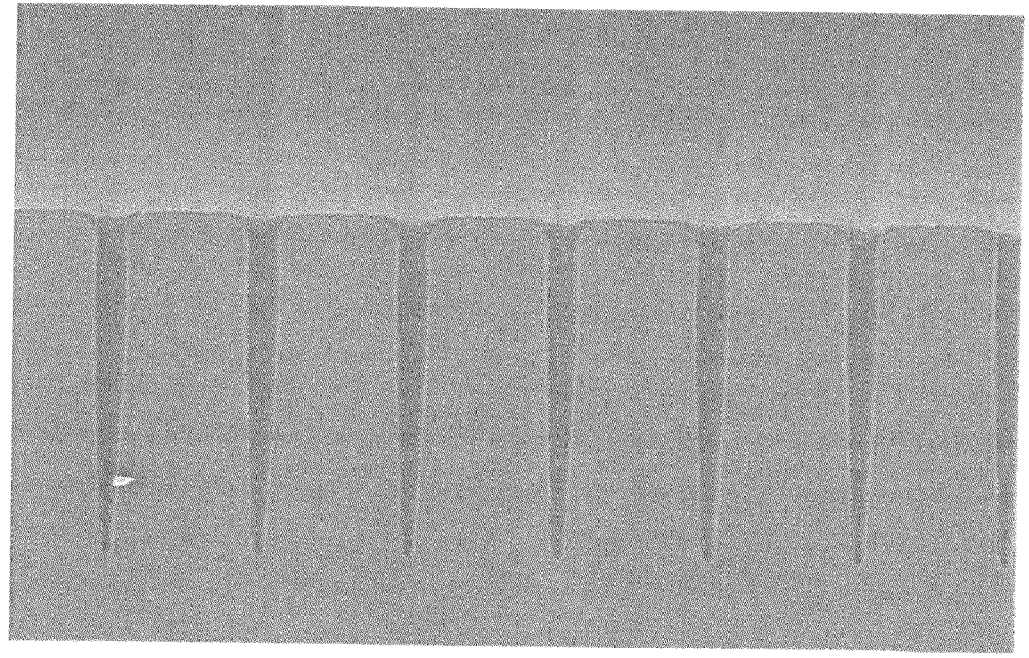
FIG. 3 is a an scanning electron microscope (SEM) image (20,000×) of Material A filling in trenches from Example 1.

Material A was then spin coated (static dispense) onto a patterned test substrate of trenches (0.65 μm×6.5 μm) under the following conditions: spin-applied at a speed of 1,500 rpm for 60 seconds and then baked at 110° C. for 2 minutes followed by 230° C. for 1 minute. An SEM cross-section picture (FIG. 3) indicated that the material completely filled in the trenches with about 1.5 μm of overburden.

Example 2

Fluorine-containing Planarization Material B

A further planarization composition was prepared by dissolving 40.0 grams of LUMIFLON® LF710F (powder coating resin; Asahi Glass, Exton, Pa.) in 60.0 grams of cyclopentanone (Aldrich Chemical, Milwaukee, Wis.) overnight until fully dissolved. Next, 4.0 grams of Cymel 303LF (Cytec Industries Inc., Woodland Park, N.J.) and 0.40 grams of K-Pure TAG 2689 (King Industries, Inc, Norwalk, Conn.) were then added to the formulation and mixed by rotation on a wheel for 2 hours until fully dissolved. The finished formulation (Material B) was a clear viscous liquid.

A solvent stripping test was then performed to test the solvent resistance of the cured planarization material. Material B was coated on a 4-inch silicon wafer at 1,500 rpm for 60 seconds and then baked at 100° C. for 2 minutes, followed by a 205° C. bake for 2 minutes. Film thickness was 8.4 μm as measured using a Dektak 8 profilometer. PGMEA was then applied on top of the film for 40 seconds followed by spinning at 1,500 rpm for 30 seconds to remove the solvent. The film thickness after PGMEA stripping was 8.25 μm. A 0.18% loss was observed, indicating that the cured film was fully crosslinked.

Example 3

Fluorine-containing Planarization Material C

In this Example, 40.0 grams of LUMIFLON® LF916F were dissolved in 60.0 grams of cyclopentanone overnight until fully dissolved. Next, 4.0 grams of Cymel 303LF and 0.40 grams of K-Pure TAG 2689 were then added to the formulation and mixed by rotation on a wheel for 2 hours until fully dissolved. The finished formulation (Material C) was a clear viscous liquid.

A solvent stripping test was then performed using the material. Material C was coated onto a 4-inch silicon wafer at 1,500 rpm for 60 seconds and then baked at 100° C. for 2 minutes followed by a 205° C. bake for 2 minutes. Film thickness was 4.96 μm as measured using a Dektak 8 profilometer. PGMEA was then applied on top of the film for 40 seconds followed by spinning at 1,500 rpm for 30 seconds to remove the solvent. The film thickness after PGMEA stripping was 4.84 μm. A 2.4% loss was observed, indicating that the film was fully crosslinked.

Figure 4:
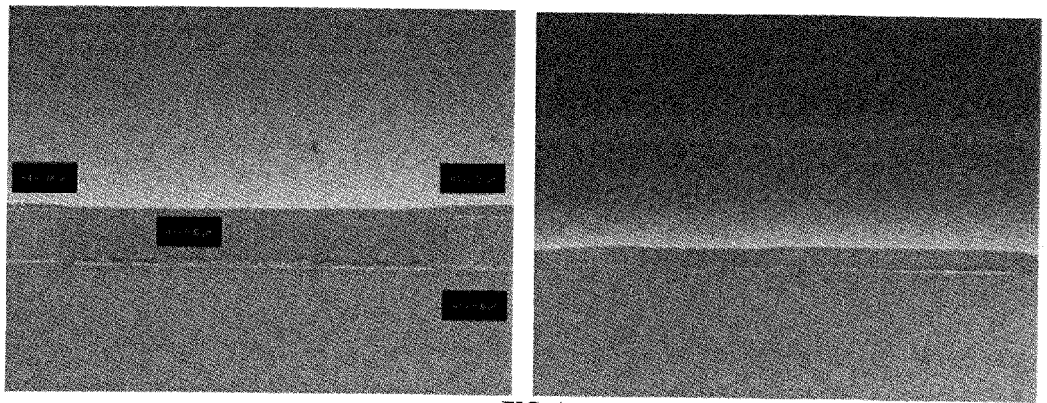
FIG. 4 is are SEM images from the filling property evaluation for Material C from Example 3.

Material C was also spin coated (static dispense) on a patterned test substrate with trenches under the following conditions: spin-applied at a speed of 1,000 rpm for 60 seconds and then baked at 100° C. for 2 minutes, followed by 130° C. for 2 minutes. An SEM cross-section picture (FIG. 4) indicated that the material completely filled in the trenches with about 1.5 μm of overburden.

Example 4

Photosensitive Fluorine-containing Planarization Material D

In this Example, 10.0 grams of LUMIFLON® LF916F and 1.0 gram of Cymel 303LF were mixed in 30.0 grams of PGME (Ultra Pure Solutions, Inc, Castroville, Calif.) and 30 grams of PGMEA (Ultra Pure Solutions, Inc.) overnight until fully dissolved. Next, 0.36 grams of Cyracure UVI 6992 (Dow Chemical) were then added to the formulation and mixed by rotation on a wheel for 4 hours until fully dissolved. The finished formulation (Material D) was a clear liquid. The thickness was about 1.0 μm when spin coated at 1,500 rpm for 60 seconds.

Figure 5:
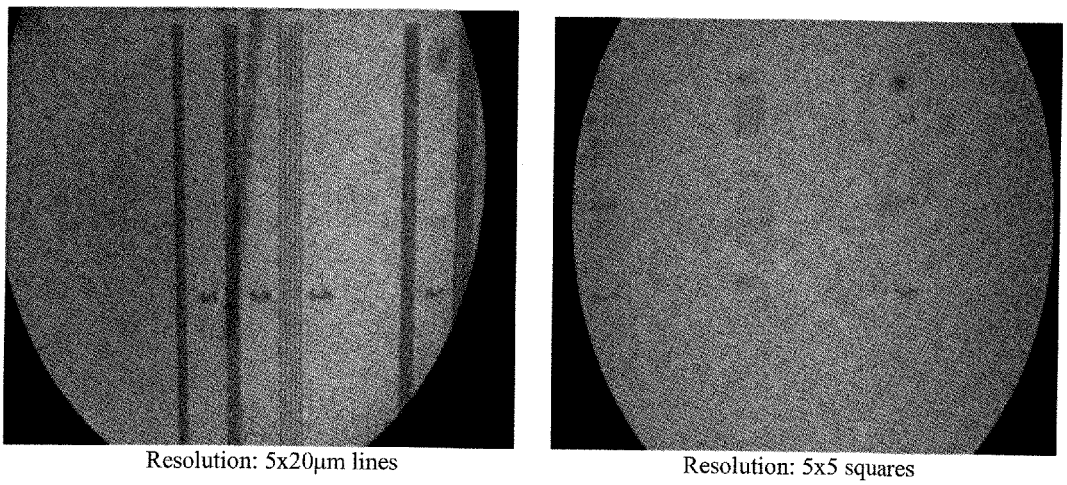
FIG. 5 are microscope images for the photosensitivity test of Material C from Example 4.

To test the photosensitivity of Material D, the composition was spin coated onto a wafer substrate at 1,500 rpm for 60 seconds and baked at 100° C. for 2 minutes. Exposure was performed using a SUSS mask aligner and broadband radiation at a dose of 500 mJ/cm². Post-exposure bake (PEB) was carried out at 130° C. for 2 minutes. PGMEA was used as a solvent developer according to the following process: The developer was puddled (0 rpm) for 40 seconds and then spun off at 1,500 rpm for 30 seconds. The final bake was 130° C. for 2 minutes. FIG. 5 shows the images of the wafer under a microscope.

Example 5

Synthesis of AAEM/MMA Copolymer A

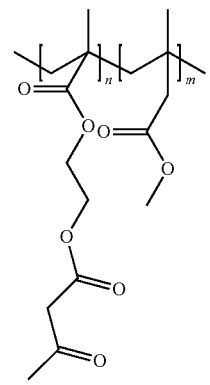

In this Example, a further planarization material was prepared by adding 100 grams of PGMEA (Ultra Pure Solutions, Inc.) to a four-neck round-bottom flask and heating up to 95° C. in an oil bath. The four-neck flask was also connected to a condenser with cooling water on during heating and reaction. A mixture containing 83.3 grams of AAEM (Sigma Aldrich), 16.7 grams MMA (Monomer-Polymer & Dajac Lab), and 3 grams of AIBN (Sigma Aldrich) was added dropwise into the PGMEA over 3 hours. During the reaction, the solution was agitated with an air-driven stirrer and purged with $N_2$. After the addition, the polymerization reaction continued at 95° C. for 1 hour. The heat was then turned off and the solution was cooled and bottled.

The resulting composition consisted of residual solvent and the copolymer, which had a molecular weight, Mw, between 10,200 to 12,100 Daltons, and a Brookfield viscosity of 147.5 to 176.5 cps at 100° F.

Example 6

Figure 6:
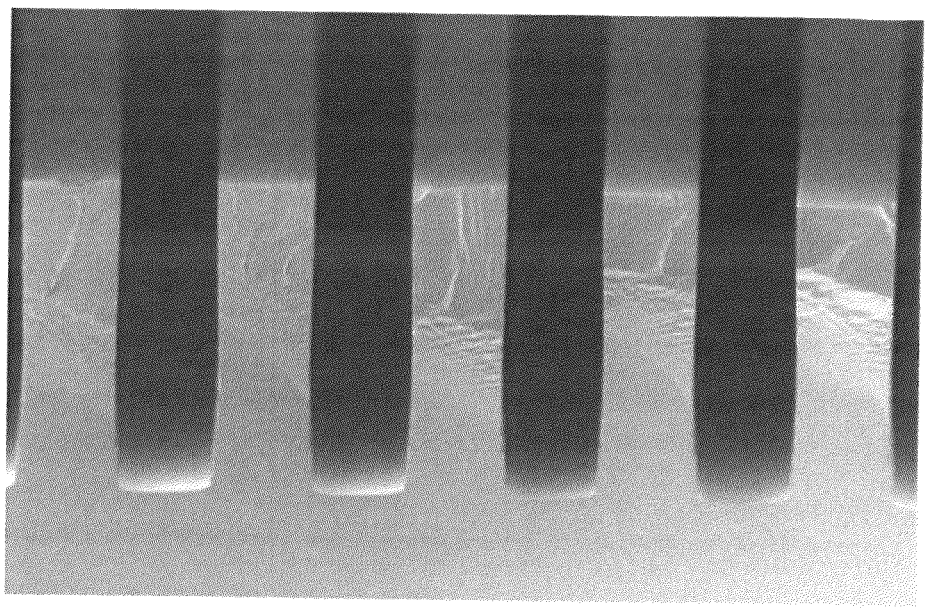
FIG. 6 is an SEM image (400×) showing the patterned substrate used in Example 6.
Figure 7:
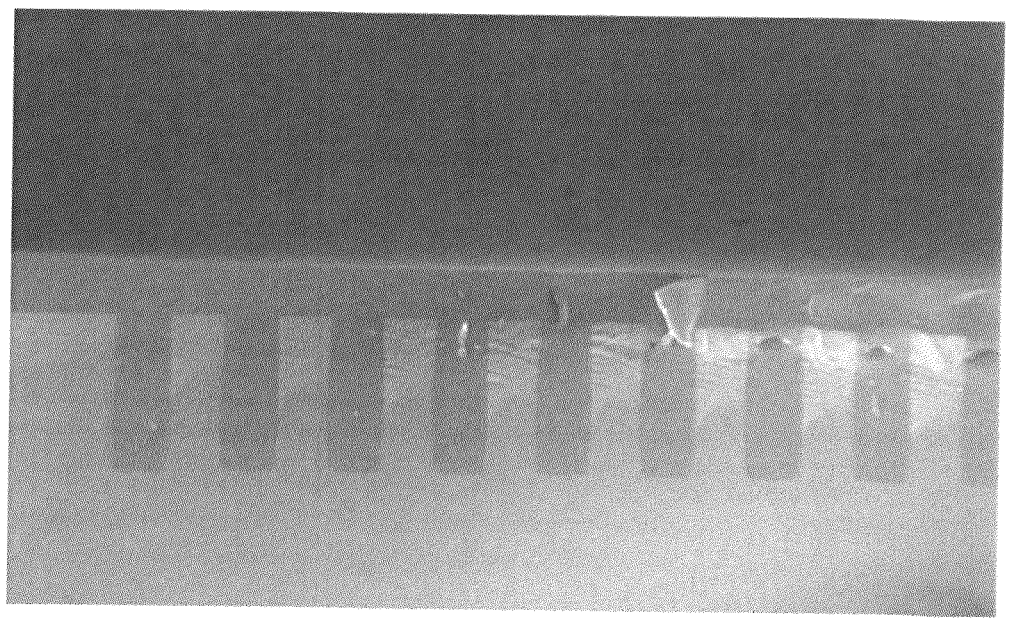
FIG. 7 is an SEM image (200×) the trenches from Example 6 filled and planarized with AAEM/MMA Copolymer A material.

Filling and Planarization of 300 μm Deep and 100 μm Wide Trenches with AAEM/MMA Copolymer A A layer of AAEM/MMA Copolymer A composition was formed on a patterned test substrate (FIG. 6, trenches 300 μM deep and 100 μm wide) by puddling the composition onto the substrate, followed by spinning at 300 rpm for 15 seconds. The substrate was then baked at 100° C. for 5 minutes followed by 150° C. for 5 minutes. A second layer of AAEM/MMA Copolymer A was then applied by puddling the composition onto the first layer then spinning at 300 rpm for 15 seconds. The coated substrate was then baked at 100° C. for 5 minutes, followed by 150° C. for 10 minutes. As can be seen from the SEM cross-section image (FIG. 7), the planarization material completely filled in the trenches without voids.

Example 7

AAEM/MMA Copolymer B Materials

In this Example, 85.397 grams of AAEM/MMA Copolymer A from Example 5 was mixed with 12.810 grams of Cymel 1170 (Cytec Industries Inc.) at 50 wt % in PGME (Ultra Pure Solutions, Inc.), 1.708 grams of UVI 6976 (The Dow Chemical Company), and 0.085 grams of Megaface R-30N (DIC Corporation) by rotation on a wheel until well mixed. The resulting material was then tested and confirmed for broadband photosensitivity.

Figure 8:
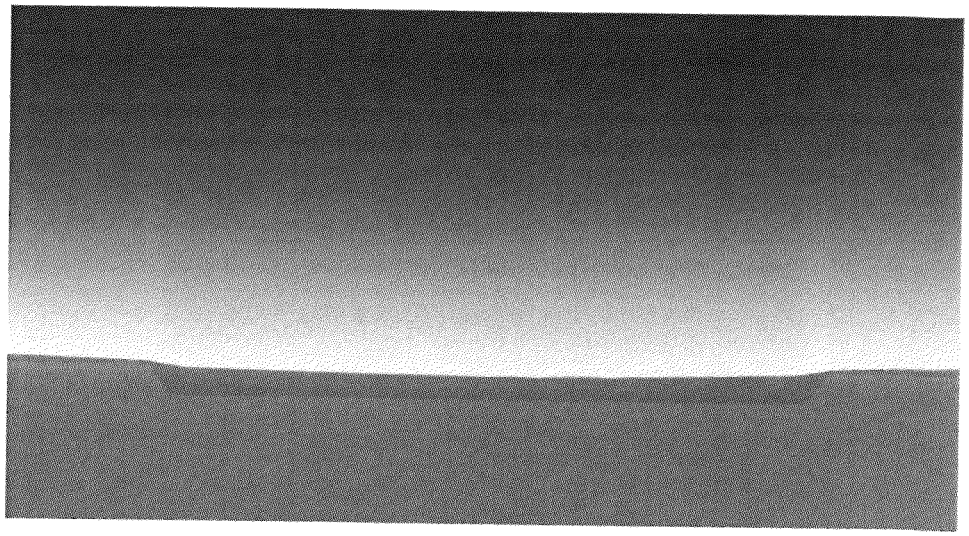
FIG. 8 shows an SEM image (2,000×) of a trench filled with AAEM/MMA Copolymer B material from Example 7.

The planarization capabilities of the composition were tested by spin applying AAEM/MMA Copolymer B at 35 wt % solids onto a patterned test substrate at 1,200 rpm for 60 seconds. The coated substrate was then baked using a hotplate set at 100° C. for a bake time of 2 minutes. A second bake step was then performed using a hotplate set at 150° C. for a bake time of 2 minutes. Exposure was then performed using a SUSS MicroTec MJB4 Mask Aligner with a 500 mJ/cm$^2$ dose. A PEB was then performed on the exposed substrate using a hotplate set at 120° C. for 2 minutes. The composition (35 wt % solids) was able to fill the trenches (100 μm wide×6 μm deep), as shown in the SEM cross-section image (FIG. 8).

Figure 9:
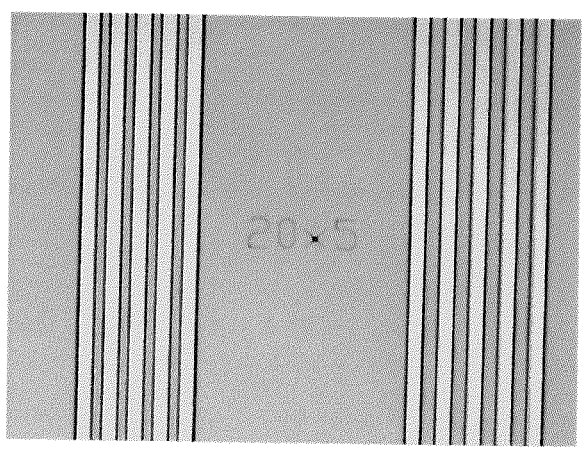
FIG. 9 shows microscope pictures of a pattern generated with AAEM/MMA Copolymer B material and developed with PD523AD from Example 7.

The AAEM/MMA Copolymer B at 35 wt % solids was also spin applied onto 4-inch blank silicon wafer using a spin process of 1,200 rpm for 60 seconds. The coated wafer was then baked using a hotplate set at 100° C. for a bake time of 2 minutes. A second bake step was also performed using a hotplate set at 150° C. for a bake time of 2 minutes. Exposure was performed using a SUSS MicroTec MJB4 Mask Aligner with a 500 mJ/cm$^2$ dose. A PEB was then performed on the exposed substrate using a hotplate set at 120° C. for 2 minutes. Then a develop step using PD523AD developer (Moses Lake Industries, Inc.) was performed by immersing the test substrate into the developer for about 50 seconds, followed by rinsing in DI water and drying under $N_2$. The resulting pattern can be seen from the microscope image in FIG. 9. A resolution of 5 μm line and 20 μM space was obtained.

Example 8

AAEM/MMA Copolymer B-1 Material

In this Example, 66.708 grams of AAEM/MMA Copolymer A, 10.006 grams of Cymel 1170 50 wt % in PGME, 1.334 grams of UVI 6976, 0.067 grams of Megaface R-30N (DIC corporation), 0.494 grams of 9-anthracenemethanol (Sigma-Aldrich), and 21.392 grams of PGMEA were mixed by rotation on a wheel until well mixed. The obtained material had a solids content of about 40 wt % and had both i-line and broadband photosensitivity.

Figure 10:
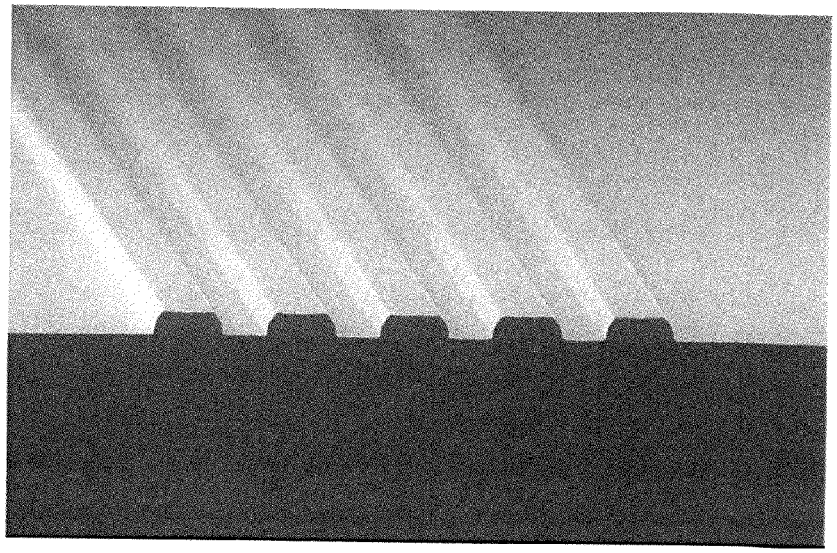
FIG. 10 is an SEM image (2,500×) of the patterned image developed from AAEM/MMA Copolymer B-1 material from Example 8.

The resulting AAEM/MMA Copolymer B-1 material was spin coated onto a blank 4-inch silicon wafer by puddling the material onto the wafer and then spinning at 1,500 rpm for 60 seconds and baking at 150° C. for 3 minutes. Exposure was performed using a SUSS MicroTec MJB4 Mask Aligner with a 150 mJ/cm$^2$ dose, followed by PEB at 110° C. for 3 minutes. PGMEA was used as a solvent developer according to the following process: 0 rpm puddle for 120 seconds followed by three cycles of a PGMEA rinse, 5 seconds off and 5 seconds on, while the wafer was spun at 1500 rpm. The wafer was then spin dried at 1,500 rpm for 30 seconds. Post development bake was at 110° C. for 2 minutes. The SEM cross-section image (FIG. 10) shows the resulting pattern. The film thickness was 4 μm. The line width is 10 μM, and the space between the lines is 10 μm.

Example 9

Formulation of AAEM/MMA Copolymer B-2 Material

In this Example, 68.335 grams of AAEM/MMA Copolymer A, 4.783 grams of Powderlink 1174 (Cytec Industries Inc.), 0.638 grams of UVI 6976, 0.068 grams of Megaface R-30N (DIC corporation), 0.236 grams of 9-anthracenemethanol (Sigma-Aldrich), and 25.939 grams of PGMEA were mixed by rotation on a wheel until mixed well. The obtained material had a solids content about 40 wt % and had both i-line and broadband photosensitivity.

Example 10

Formulation of Terpolymer with AAEM

In this Example, a terpolymer was synthesized by first adding 100 grams of PGMEA to a four-neck round-bottom flask and heating up to 95° C. in an oil bath. The four-neck flask was also connected to a condenser with cooling water on during heating and reaction. A mixture of 83.3 grams of AAEM, 11.7 grams of MMA, 5.0 grams of n-butyl acrylate (Sigma Aldrich), and 3 grams of AIBN was then added dropwise into the PGMEA over 3 hours. During the reaction, the solution was agitated with an air-driven stirrer and purged with $N_2$. After the addition, the reaction continued at 95° C. for 1 hour. The heat was then turned off and the solution was cooled and bottled.

Figure 11:
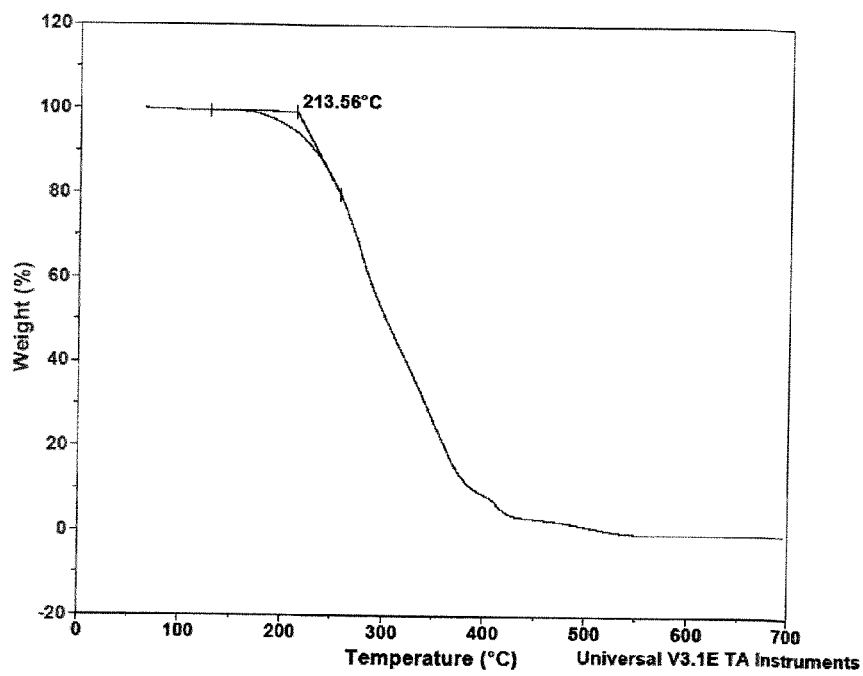
FIG. 11 is a graph of the thermal decomposition temperature (Td) of the terpolymer prepared in Example 10 by thermogravimetric analysis (TGA, ramp 10° C./min under air)
Figure 12:
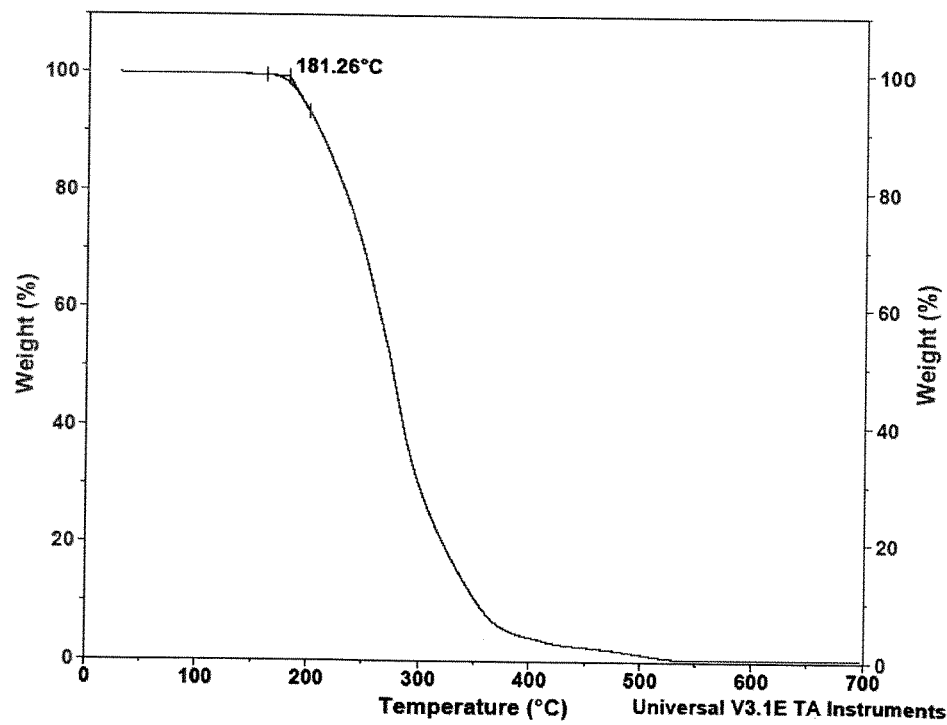
FIG. 12 is a graph of the thermal decomposition temperature (Td) of Copolymer A by thermogravimetric analysis (TGA, ramp 10° C./min under air) from Example 10.

The resulting composition consisted of the terpolymer and had a molecular weight, Mw, of 11,700, and a Brookfield viscosity of 134.75 cps at 100° F. The thermal decomposition of the terpolymer is shown in FIG. 11 and contrasted with AAEM/MMA Copolymer A (FIG. 12).

What is claimed is:

1. A method of forming a microelectronic structure, said method comprising:
providing a wafer stack comprising:
a substrate having a surface; and
a pattern comprising a plurality of features formed in and/or on said substrate surface, wherein said features formed on the substrate surface are defined by respective sidewalls and a top surface, and wherein said features formed in the substrate surface are defined by respective sidewalls and a bottom surface;
applying a planarization composition to said stack, said planarization composition covering said pattern as a non-conformal layer on said stack, wherein said planarization composition is selected from the group consisting of:
(A) a composition comprising a fluorinated compound dispersed or dissolved in a solvent system, said compound comprising recurring monomeric units containing respective fluorine moieties and one or more crosslinkable functional groups; and
(B) a composition comprising an acetoacetylated compound dispersed or dissolved in a solvent system; and
heating said planarization composition, thereby allowing said planarization composition to self-level into a planarized layer ready for the application of subsequent layers, said planarized layer having a substantially planar surface relative to said patterned substrate wherein no etching, contact planarization, and/or polishing occurs during said self-leveling.

2. The method of claim 1, wherein during said applying, said planarization layer overcoats said top surfaces, fills said features formed in said substrate surface, and is deposited adjacent said substrate surface between said features.

3. The method of claim 1, further comprising repeating said applying and said heating.

4. The method of claim 1, wherein said substrate is a microelectronic substrate, microelectromechanical substrate, LED substrate, or solar substrate.

5. The method of claim 1, wherein said substrate is selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, quartz, $Ti_3N_4$, hafnium, $HfO_2$, ruthenium, indium phosphide, GaN, and mixtures of the foregoing.

6. The method of claim 1, wherein said planarized layer is crosslinked during said heating to yield a crosslinked planarized layer.

7. The method of claim 1, further comprising exposing said stack to radiation.

8. The method of claim 7, wherein said exposing crosslinks said compound in said layer to yield a crosslinked planarized layer.

9. The method of claim 7, wherein said exposing exposing decrosslinks or deprotects said planarized layer.

10. The method of claim 7, wherein said exposing yields exposed and unexposed portions of said planarized layer.

11. The method of claim 10, further comprising selectively removing said unexposed portions of said planarized layer with a developer or solvent.

12. The method of claim 10, further comprising selectively removing said exposed portions of said planarized layer with a developer or solvent.

13. The method of claim 1, further comprising:
applying an imaging layer to said planarized layer; and
patterning said imaging layer.

14. The method of claim 13, further comprising transferring said pattern into said planarized layer.

15. The method of claim 14, wherein said transferring comprises contacting said planarized layer with a developer or solvent.

16. The method of claim 14, wherein said transferring comprises etching said planarized layer.

17. The method of claim 1, wherein said composition is (A) a composition comprising said fluorinated compound dispersed or dissolved in a solvent system, said solvent system containing a solvent selected from the group consisting of propylene glycol monomethyl ether, propylene glycol methyl ether acetate, cyclic ketones, ethyl lactate, gamma butyl lactone, dimethylacetamide, and mixtures thereof.

18. The method of claim 17 wherein said fluorinated compound has a weight average molecular weight of less than about 50,000 Daltons.

19. The method of claim 17, wherein said fluorinated compound is a heteropolymer of fluorinated ethylenically unsaturated monomers and one or more other copolymerizable ethylenically unsaturated monomers.

20. The method of claim 19, wherein said fluorinated ethylenically unsaturated monomers are selected from the group consisting of fluoroethylene, difluoroethylene, trifluoroethylene, tetrafluoroethylene, and chlorotrifluoroethylene.

21. The method of claim 19, wherein said other copolymerizable ethylenically unsaturated monomers are selected from the group consisting of ester-, ether-, acrylate-, methacrylate-, hydroxy-containing monomers, and combinations thereof.

22. The method of claim 1, wherein said composition is (B) a composition comprising said acetoacetylated compound dispersed or dissolved in a solvent system, wherein said solvent system is selected from the group consisting of propylene glycol monomethyl ether, propylene glycol methyl ether acetate, ethyl acetoacetate, ethyl lactate, ethyl 3-ethoxypropionate, ketones, and mixtures thereof.

23. The method of claim 22, wherein said acetoacetylated compound comprises acetoacetoxyethyl pendant groups.

24. The method of claim 22, wherein said acetoacetylated compound comprises recurring monomeric units of formula (I):

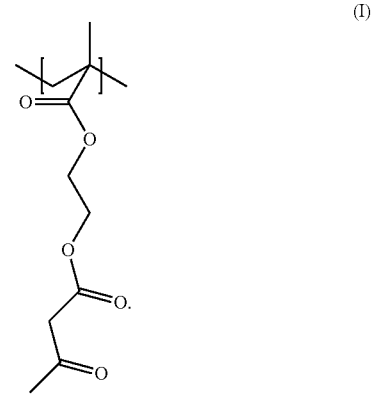

25. The method of claim 24, wherein said acetoacetylated compound is a heteropolymer comprising recurring monomeric units of formula (I) with one or more additional copolymerizable monomers.

26. The method of claim 25, wherein said additional copolymerizable monomers are selected from the group consisting of acrylate-, methacrylate-, and styrene-containing monomers.

27. The method of claim 22, wherein said acetoacetylated compound has a weight average molecular weigh of less than about 30,000 Daltons.

* * * * *